(12) United States Patent
Li et al.

(10) Patent No.: US 11,126,227 B2
(45) Date of Patent: Sep. 21, 2021

(54) ELECTRONIC DEVICE

(71) Applicants: Ching-Hua Li, Taipei (TW); I-Lung Chen, Taipei (TW); Nien-Chen Lee, Taipei (TW)

(72) Inventors: Ching-Hua Li, Taipei (TW); I-Lung Chen, Taipei (TW); Nien-Chen Lee, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 100 days.

(21) Appl. No.: 16/568,207

(22) Filed: Sep. 11, 2019

(65) Prior Publication Data

US 2020/0089280 A1    Mar. 19, 2020

Related U.S. Application Data

(60) Provisional application No. 62/732,540, filed on Sep. 17, 2018.

(51) Int. Cl.
*G06F 1/16* (2006.01)
*H05K 5/02* (2006.01)

(52) U.S. Cl.
CPC .......... *G06F 1/1652* (2013.01); *G06F 1/1615* (2013.01); *G06F 1/1616* (2013.01);
(Continued)

(58) Field of Classification Search
CPC .... G06F 1/1615; G06F 1/1616; G06F 1/1618; G06F 1/1652; G06F 1/1681
See application file for complete search history.

(56) References Cited

U.S. PATENT DOCUMENTS 7,283,355 B2 * 10/2007 Han .................. G06F 1/162
                                                      248/917
7,898,565 B2 *  3/2011 Moengen .......... G06F 1/1605
                                                     348/14.08
(Continued)

FOREIGN PATENT DOCUMENTS

CN      106406426       2/2017
TW      M353411         3/2009
(Continued)

OTHER PUBLICATIONS

"Office Action of China Counterpart Application", dated Sep. 17, 2020, p. 1-p. 7.

*Primary Examiner* — Nidhi Thaker
(74) *Attorney, Agent, or Firm* — JCIPRNET

(57) ABSTRACT

An electronic device includes a main frame, a support component pivoted to the main frame, a flexible display panel connected between the main frame and the support component, and a display movably connected to the support component. The support component is adapted to be closed to the main frame to fold the flexible display panel between the main frame and the support component, and is adapted to be opened from the main frame to expand the flexible display panel. When the support component is opened, the display is adapted to rotate relative to the support component to a first state such that the display and the flexible display panel are located on the same side of the support component, and to rotate relative to the support component to a second state such that the display and the flexible display panel are located on different sides of the support component.

15 Claims, 7 Drawing Sheets

(52) U.S. Cl.
CPC ......... *G06F 1/1618* (2013.01); *G06F 1/1624* (2013.01); *G06F 1/1681* (2013.01); *H05K 5/0204* (2013.01); *H05K 5/0226* (2013.01); *G06F 2200/1612* (2013.01)

(56) References Cited

U.S. PATENT DOCUMENTS

| | | | | |
|---|---|---|---|---|
| 8,289,685 | B2* | 10/2012 | Li | G06F 1/1616 361/679.26 |
| D881,873 | S * | 4/2020 | Li | D14/316 |
| 10,840,464 | B2* | 11/2020 | Hiroki | H01L 51/0097 |
| 2015/0062525 | A1* | 3/2015 | Hirakata | G06F 1/1641 349/158 |
| 2016/0128439 | A1* | 5/2016 | Senatori | G06F 1/162 206/45.2 |
| 2017/0023977 | A1* | 1/2017 | Xin | G06F 1/1643 |
| 2017/0177037 | A1* | 6/2017 | Koo | G06F 1/1616 |
| 2017/0310799 | A1* | 10/2017 | Lin | G06F 1/1652 |

FOREIGN PATENT DOCUMENTS

| | | |
|---|---|---|
| TW | 201142772 | 12/2011 |
| TW | 201827980 | 8/2018 |
| WO | 2015139226 | 9/2015 |

\* cited by examiner

ELECTRONIC DEVICE

CROSS REFERENCE TO RELATED APPLICATION

This application claims the priority benefit of U.S. provisional application Ser. No. 62/732,540, filed on Sep. 17, 2018. The entirety of the above-mentioned patent application is hereby incorporated by reference herein and made a part of specification.

TECHNICAL FIELD

The invention relates to an electronic device, and more particularly to an electronic device having a flexible display panel.

RELATED ART

Portable electronic devices, such as notebook computers, tablets, smartphones and so on, have long been popular in the consumer market. Among them, notebook computers cannot be replaced by tablets and smartphones by features such as a physical keyboard and the same operating system as personal computers. Moreover, since a notebook computer is composed of a plurality of bodies (at least a main frame and a display), its overall form and operation mode can be switched as the bodies change their relative positions. This is also a relative advantage of notebook computers in the market. Therefore, if such an advantage is used in designing a notebook computer which can more flexibly switch an operation mode, the irreplaceability of notebook computers can increase.

SUMMARY

The invention provides an electronic device capable of flexibly switching an operation mode.

An electronic device of the invention includes a main frame, a support component, a flexible display panel and a display. The support component is pivoted to the main frame. The flexible display panel is connected between the main frame and the support component. The support component is adapted to be closed to the main frame such that the flexible display panel is folded between the main frame and the support component, and the support component is adapted to be opened from the main frame such that the flexible display panel is expanded. The display is movably connected to the support component. When the support component is opened from the main frame, the display is adapted to rotate relative to the support component to a first state such that the display and the flexible display panel are located on the same side of the support component, and to rotate relative to the support component to a second state such that the display and the flexible display panel are located on different sides of the support component.

In an embodiment of the invention, when the support component is closed to the main frame, the display is adapted to be sandwiched between the main frame and the support component.

In an embodiment of the invention, when the support component is closed to the main frame, the support component is adapted to be sandwiched between the main frame and the display.

In an embodiment of the invention, the main frame has an input interface, and one end of the flexible display panel is adjacent to the input interface.

In an embodiment of the invention, a portion of the flexible display panel adjacent to the input interface is adapted to function as a virtual button.

In an embodiment of the invention, when the display and the flexible display panel are located on the same side of the support component, at least a portion of the flexible display panel is exposed between the display and the main frame.

In an embodiment of the invention, when the display and the flexible display panel are located on different sides of the support component, the display and the flexible display panel are adapted to display the same screen or respectively display corresponding screens.

In an embodiment of the invention, the display has a connecting part, and the connecting part is slidably disposed on the support component and is adapted to slide between a first position and a second position relative to the support component. When the connecting part is in the first position, an interference between the support component and the display limits the display to the first state, and when the connecting part is in the second position, the display is adapted to rotate relative to the support component to the second state.

In an embodiment of the invention, the connecting part includes a pivot, the support component has a sliding groove, and the pivot is slidably disposed in the sliding groove.

In an embodiment of the invention, when the connecting part is in the first position, an end face of the connecting part is flush with an end face of the support component.

In an embodiment of the invention, the electronic device includes a guide component. The connecting part is pivoted to the guide component. The guide component has at least one first guide structure and is slidably disposed on the support component. The support component has at least one second guide structure. The at least one first guide structure and the at least one second guide structure cooperate to guide the connecting part and the guide component to slide relative to the support component.

In an embodiment of the invention, at least one of the main frame and the support component has at least one covering part, and the at least one covering part covers a portion of a peripheral edge of the flexible display panel.

In an embodiment of the invention, a bending section of the flexible display panel is located between the main frame and the support component, and is adapted to bend as the support component rotates relative to the main frame. The at least one covering part has a concessive notch. The concessive notch extends to an end of the at least one covering part and provides space for bending of the bending section of the flexible display panel.

In an embodiment of the invention, the flexible display panel has at least one adhering section adjacent to the bending section, the at least one adhering section is adhered to the main frame or the support component, and the concessive notch extends from a junction of the bending section and the at least one adhering section to the end of the at least one covering part.

In an embodiment of the invention, a bending section of the flexible display panel is located between the main frame and the support component, and is adapted to bend as the support component rotates relative to the main frame. At least one of the main frame and the support component has at least one shielding part, and the at least one shielding part shields at least a portion of a side edge of the bending section of the flexible display panel.

In an embodiment of the invention, a bending section of the flexible display panel is located between the main frame and the support component, and is adapted to bend as the support component rotates relative to the main frame. At least one of the main frame and the support component has a concessive recess, a back surface of the bending section of the flexible display panel faces the concessive recess, and the concessive recess provides space for bending of the bending section of the flexible display panel.

Based on the above, in the electronic device of the invention, in addition to the display as a main display interface, the flexible display panel is disposed as an auxiliary display interface. The display may be turned over such that the display and the flexible display panels are located on the same side of the support component or on different sides of the support component. Also, the electronic device can be switched to different operation modes according to changes in display screens displayed by the display and the flexible display panel. In the invention, since the flexible display panel instead of a general display which is non-flexible and of large thickness is used as the auxiliary display interface, it does not excessively increase the volume of the electronic device or excessively occupy configuration space in the electronic device.

DESCRIPTION OF THE EMBODIMENTS

Figure 1:
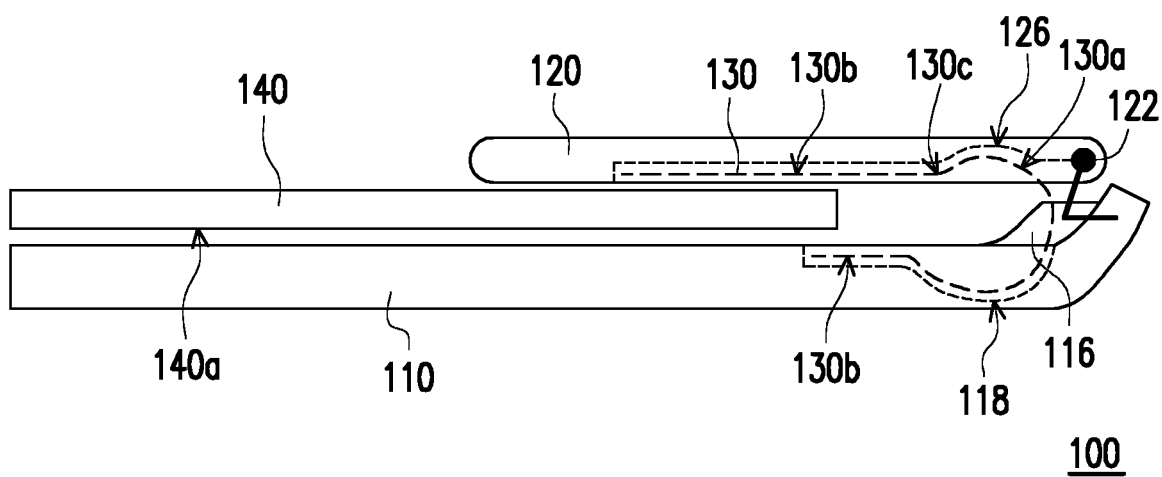
FIG. 1 is a schematic side view of an electronic device according to an embodiment of the invention.
Figure 2:
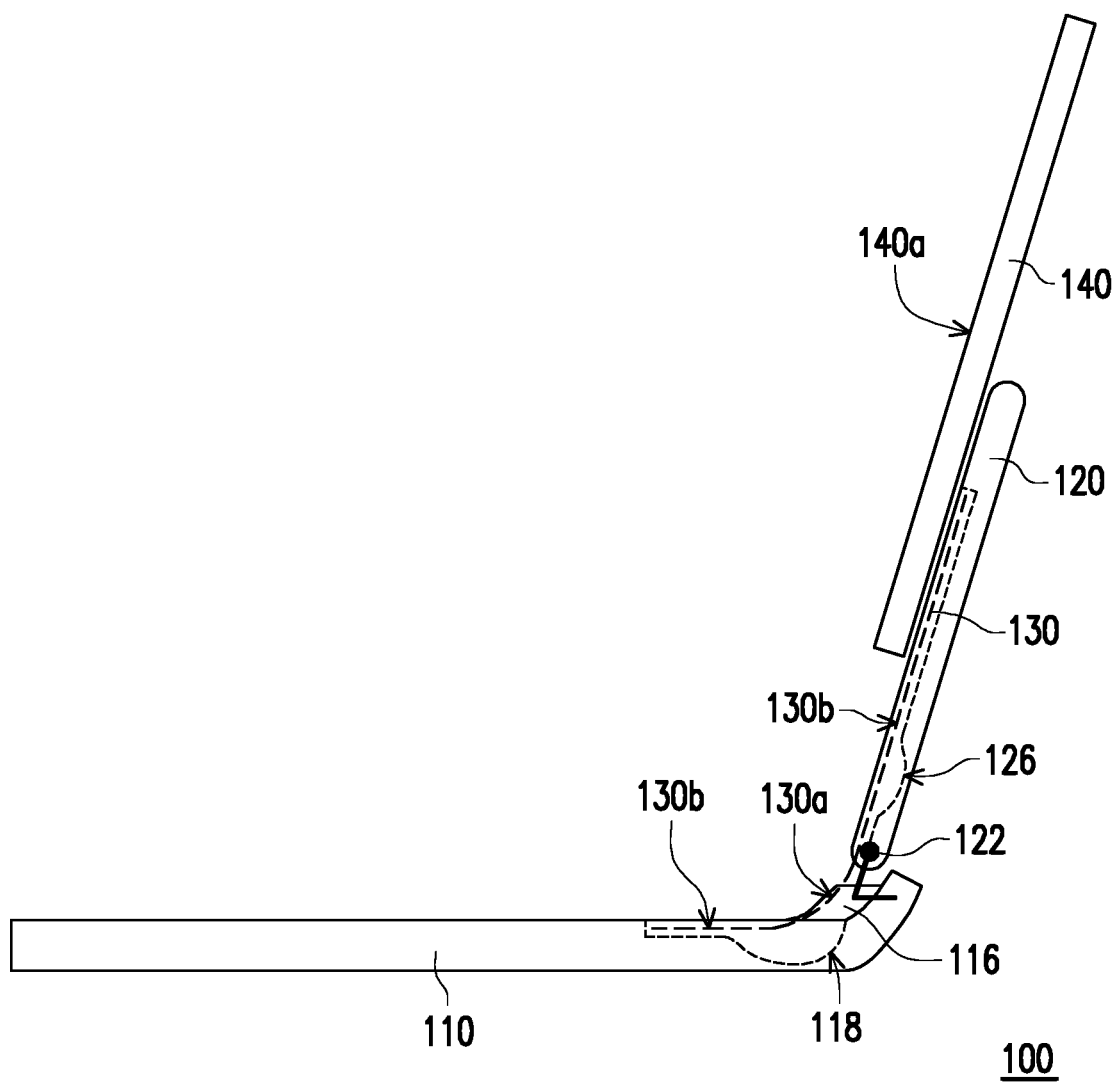
FIG. 2 illustrates that a support component of FIG. 1 is opened from the main frame.
Figure 3:
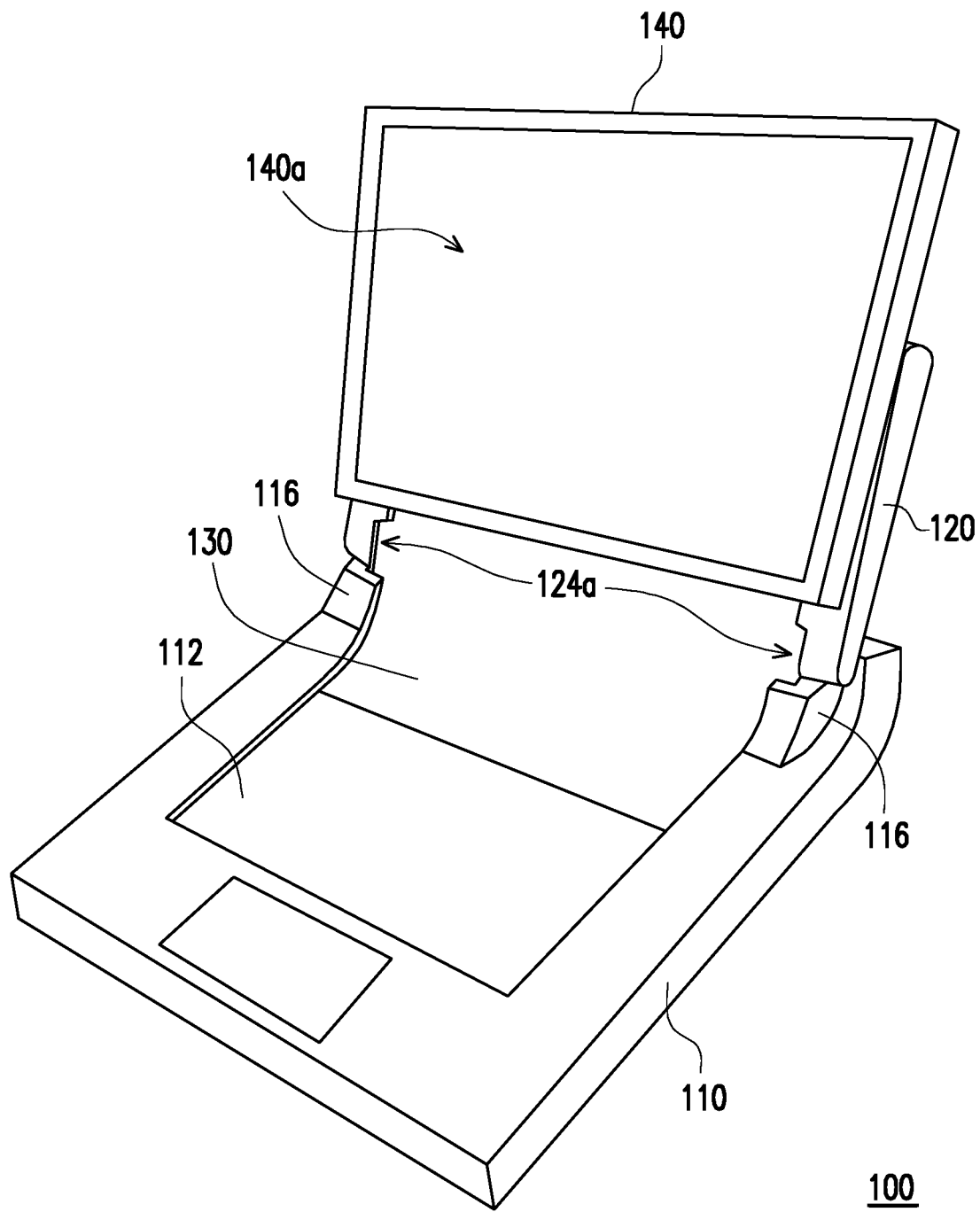
FIG. 3 is a schematic three-dimensional view of the electronic device of FIG. 2.

FIG. 1 is a schematic side view of an electronic device according to an embodiment of the invention. FIG. 2 illustrates that a support component of FIG. 1 is opened from the main frame. FIG. 3 is a schematic three-dimensional view of the electronic device of FIG. 2. Referring to FIG. 1 to FIG. 3, an electronic device 100 of the present embodiment includes a main frame 110, a support component 120, a flexible display panel 130 and a display 140. The support component 120 is pivoted to the main frame 110 via a pivot component 122 (shown in FIG. 1 and FIG. 2). The flexible display panel 130 is connected between the main frame 110 and the support component 120. The support component 120 is adapted to be closed to the main frame 110 as shown in FIG. 1, such that the flexible display panel 130 is folded between the main frame 110 and the support component 120, and that the display 140 is sandwiched between the main frame 110 and the support component 120. Moreover, the support component 120 is adapted to be opened from the main frame 110 as shown in FIG. 2 and FIG. 3 such that the flexible display panel 130 is expanded.

Figure 4:
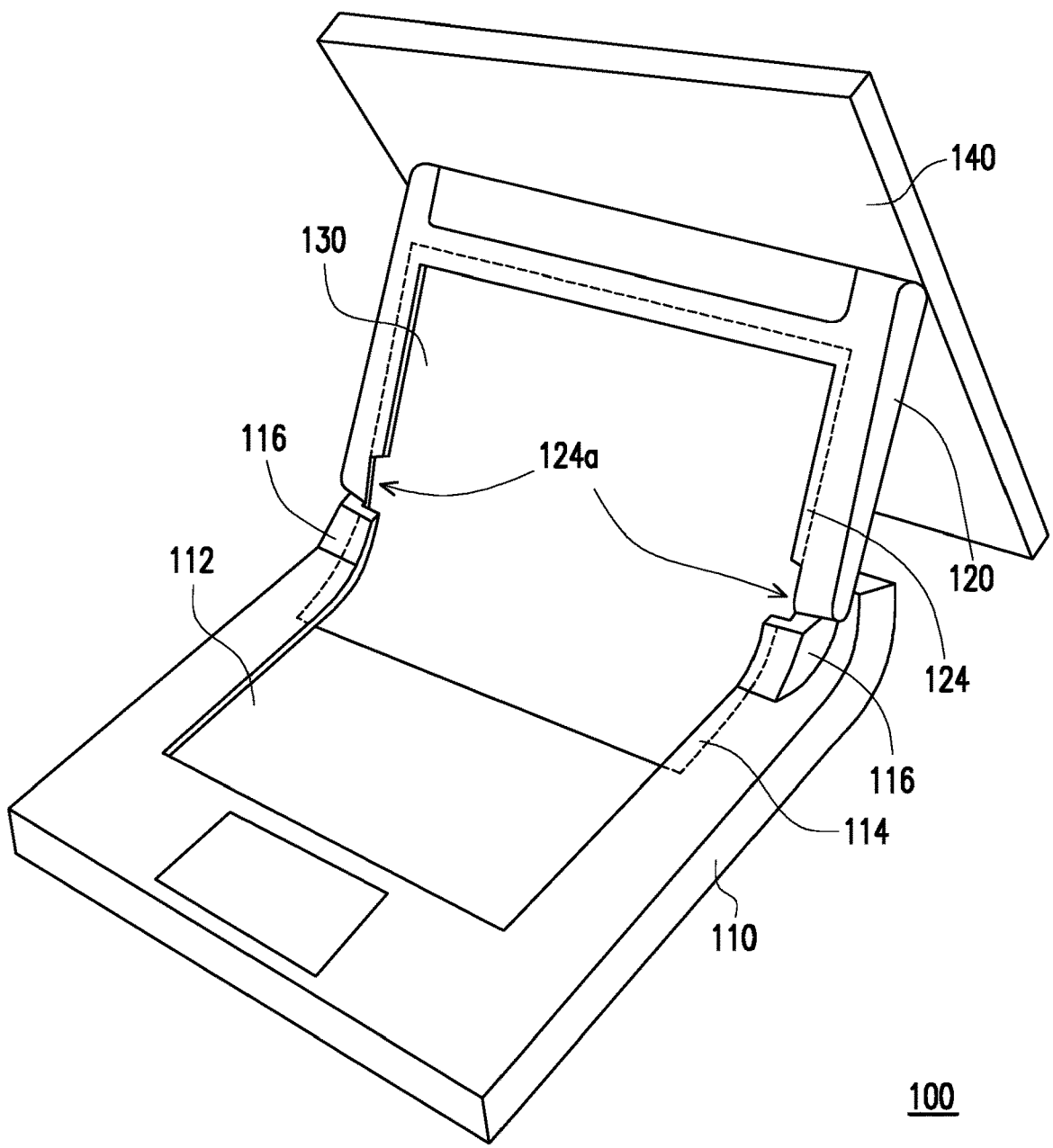
FIG. 4 illustrates that a display of FIG. 3 is turned over.

FIG. 4 illustrates that the display of FIG. 3 is turned over. In the present embodiment, the display 140 is movably connected to the support component 120 and can be turned over relative to the support component 120. Specifically, when the support component 120 is opened from the main frame 110, the display 140 is adapted to rotate relative to the support component 120 to a first state as shown in FIG. 2 and FIG. 3, such that the display 140 and the flexible display panel 130 are located on the same side of the support component 120. At this time, a portion of the flexible display panel 130 is exposed between the display 140 and the main frame 110. In addition, when the support component 120 is opened from the main frame 110, the display 140 is adapted to rotate relative to the support component 120 to a second state as shown in FIG. 4, such that the display 140 and the flexible display panel 130 are respectively located on different sides of the support component 120. Accordingly, the electronic device can be switched to different operation modes according to changes in display screens displayed by the display 140 and the flexible display panel 130.

For example, when the display 140 and the flexible display panel 130 are located on the same side of the support component 120 as shown in FIG. 3, the display 140 may be used to display a main screen, and the flexible display panel 130 is used to display an auxiliary screen. When the display 140 and the flexible display panel 130 are respectively located on different sides of the support component 120 as shown in FIG. 4, the display 140 and the flexible display panel 130 may display the same screen or corresponding screens to enable users respectively located on different sides of the electronic device 100 to simultaneously view the same or corresponding screen information through the display 140 and the flexible display panel 130 respectively.

Further, in the present embodiment, the main frame 110 has an input interface 112 as shown in FIG. 3 and FIG. 4, and the input interface 112 is, for example, a keyboard module. One end of the flexible display panel 130 is adjacent to the input interface 112. In the case where the flexible display panel 130 has a touch function, a portion of the flexible display panel 130 adjacent to the input interface 112 may function as a virtual button and be integrated as part of the input interface 112.

Figure 5:
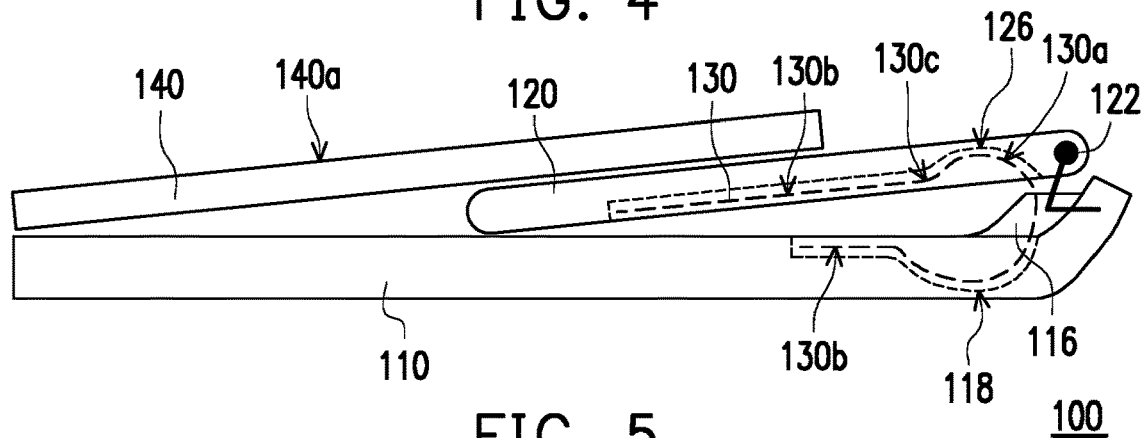
FIG. 5 illustrates that the support component of FIG. 4 is closed to the main frame.

FIG. 5 illustrates that the support component of FIG. 4 is closed to the main frame. Further, in the electronic device 100 of the present embodiment, the support component 120 may be closed to the main frame 110 in a state in which the display 140 and the flexible display panel 130 are respectively located on different sides of the support component 120, as shown in FIG. 5. At this time, the support component 120 is sandwiched between the main frame 110 and the display 140, and a display face 140a of the display 140 that has a touch display function is exposed to change the electronic device 100 into a tablet operation mode.

In the present embodiment, since the flexible display panel 130 instead of a general display which is non-flexible and of large thickness is used as an auxiliary display interface, it does not excessively increase the volume of the electronic device 100 or excessively occupy configuration space in the electronic device 100.

Referring to FIG. 4, the main frame 110 and the support component 120 of the present embodiment respectively have a covering part 114 and a covering part 124. The covering part 114 and the covering part 124 cover a portion of a peripheral edge of the flexible display panel 130 to prevent the peripheral edge of the flexible display panel 130 from being damaged by an unexpected external force. In addition, in the present embodiment, a bending section 130a (labeled in FIG. 1, FIG. 2 and FIG. 5) of the flexible display panel 130 is located between the main frame 110 and the support component 120 and is adapted to bend as the support component 120 rotates relative to the main frame 110. Moreover, the flexible display panel 130 has an adhering section 130b (labeled in FIG. 1, FIG. 2 and FIG. 5) adjacent to the bending section 130a. The adhering section 130b is adhered to the main frame 110 and the support component 120 to prevent the flexible display panel 130 from being unexpectedly displaced.

Figure 6:
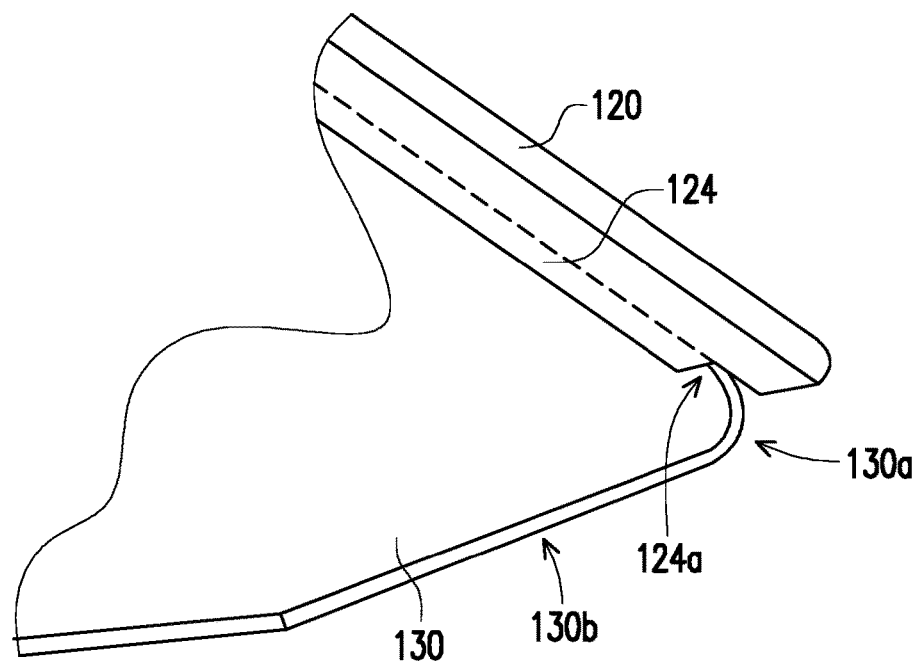
FIG. 6 is a partial three-dimensional view of the support component and a flexible display panel of FIG. 3.

FIG. 6 is a partial three-dimensional view of the support component and the flexible display panel of FIG. 3. The support component 120 is illustrated as being opened to a smaller angle in FIG. 6 than in FIG. 3. In order for the bending section 130a to bend smoothly, as shown in FIG. 3, FIG. 4 and FIG. 6, the covering part 124 has at least one (shown as two) concessive notch 124a. The concessive notch 124a extends to an end of the covering part 124 and provides space for bending of the bending section 130a of the flexible display panel 130, avoiding a situation in which the bending section 130a is blocked by the covering part 124 and cannot smoothly bend. Further, the concessive notch 124a, for example, extends from a junction 130c (labeled in FIG. 1 and FIG. 5) of the bending section 130a and the adhering section 130b to the end of the covering part 124 to have a sufficient extension range to provide the space required for complete bending of the bending section 130a. In other embodiments, the concessive notch 124a may have other suitable extension ranges, and the invention is not limited thereto. In addition, as shown in FIG. 1, FIG. 2 and FIG. 5, the main frame 110 and the support component 120 respectively have a concessive recess 118 and a concessive recess 126. A back surface of the bending section 130a of the flexible display panel 130 faces the concessive recess 118 and the concessive recess 126. The concessive recess 118 and the concessive recess 126 are also used to provide space for bending of the bending section 130a, avoiding a situation in which the bending section 130a is not allowed sufficient space for bending inside the main frame 110 and the support component 120 and is unexpectedly compressed.

The main frame 110 of the present embodiment has at least one (shown as two in FIG. 3 and FIG. 4) shielding part 116. The shielding part 116 is used to shield a portion of a side edge of the bending section 130a of the flexible display panel 130 to prevent the bending section 130a from being exposed and affecting the appearance of the electronic device 100. The shielding part 116 may have a suitable space therein for bending of the bending section 130a, and an inner wall of the shielding part 116 may have a suitable curvature for the bending section 130a to abut thereagainst.

Figures 7A, 7B, 7C:
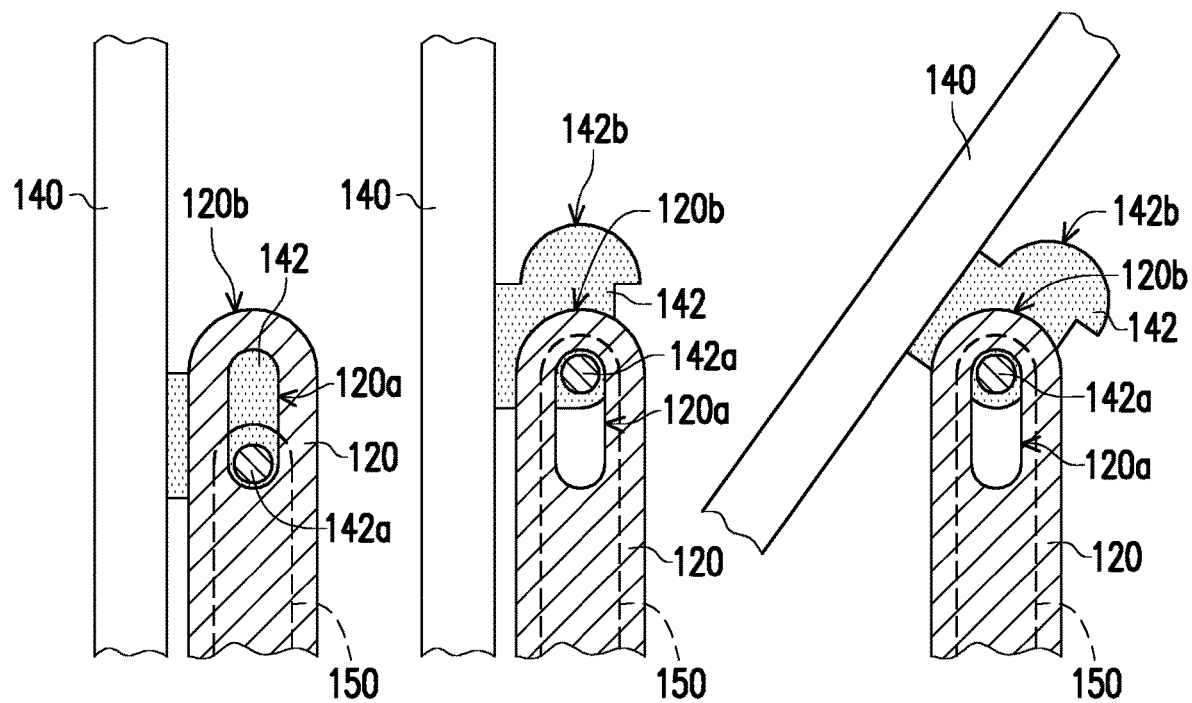
FIG. 7A to FIG. 7C are schematic views showing partial operation of the display and the support component of FIG. 2.

A connection manner between the display 140 and the support component 120 of the present embodiment is described in detail below. FIG. 7A to FIG. 7C are schematic views showing partial operation of the display and the support component of FIG. 2. Referring to FIG. 7A, the display 140 of the present embodiment has a connecting part 142, and the connecting part 142 includes a pivot 142a. The connecting part 142 is slidably disposed in a sliding groove 120a of the support component 120 via the pivot 142a, and is adapted to slide between a first position shown in FIG. 7A and a second position shown in FIG. 7B, relative to the support component 120. When the connecting part 142 is in the first position, an interference between the support component 120 and the display 140 limits the display 140 to the first state shown in FIG. 2, FIG. 3 and FIG. 7A. When the connecting part 142 is in the second position, the display 140 is adapted to rotate relative to the support component 120 as shown in FIG. 7C to the second state shown in FIG. 4. In the present embodiment, a shape of an end face 142b of the connecting part 142 is, for example, the same as a shape of an end face 120b of the support component 120. Thus, when the connecting part 142 is in the first position shown in FIG. 7A, the end face 142b of the connecting part 142 is flush with the end face 120b of the support component 120 to improve the appearance and texture.

Figure 8:
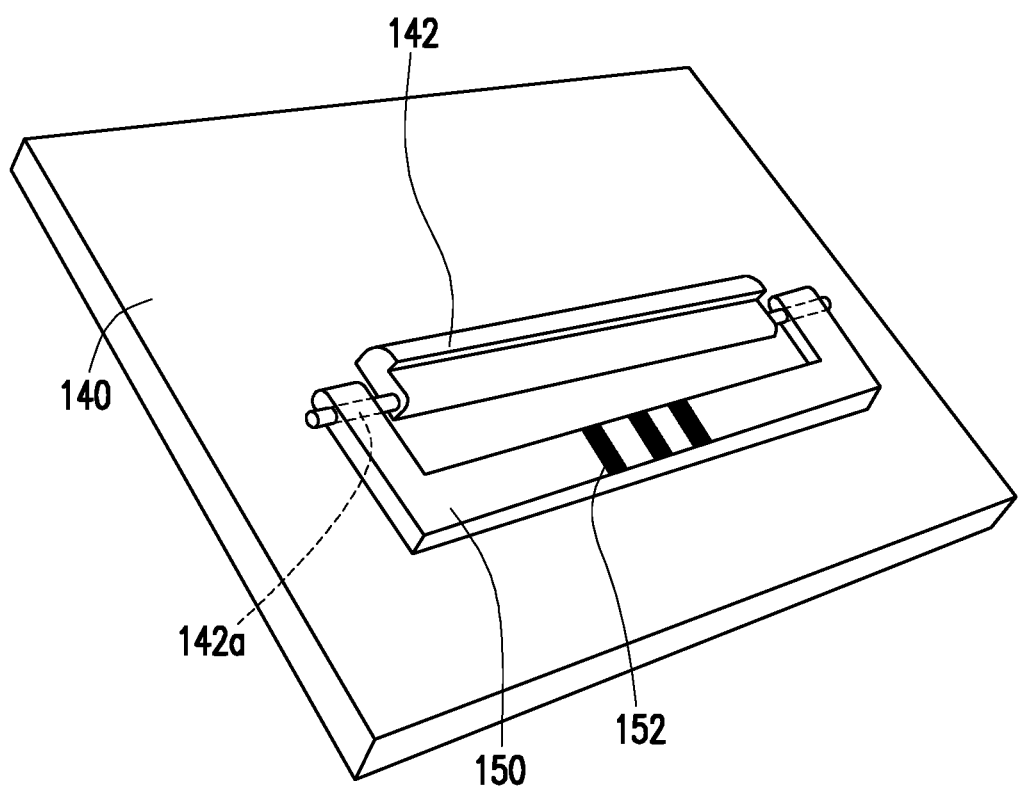
FIG. 8 is a schematic view of some members of the electronic device of FIG. 1.
Figure 9A:
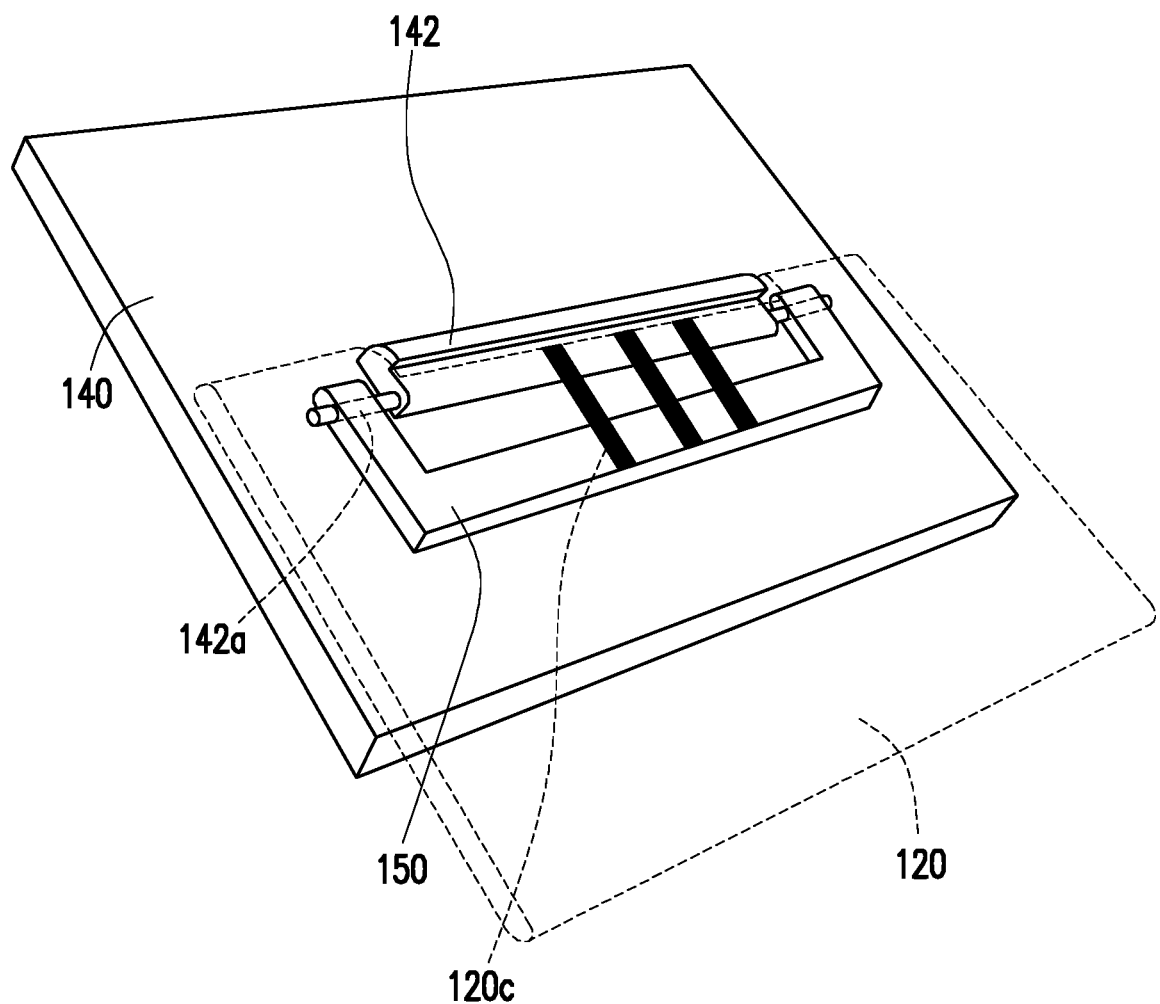
FIG. 9A and FIG. 9B illustrate that the display and a guide component of FIG. 8 move relative to the support component.
Figure 9B:
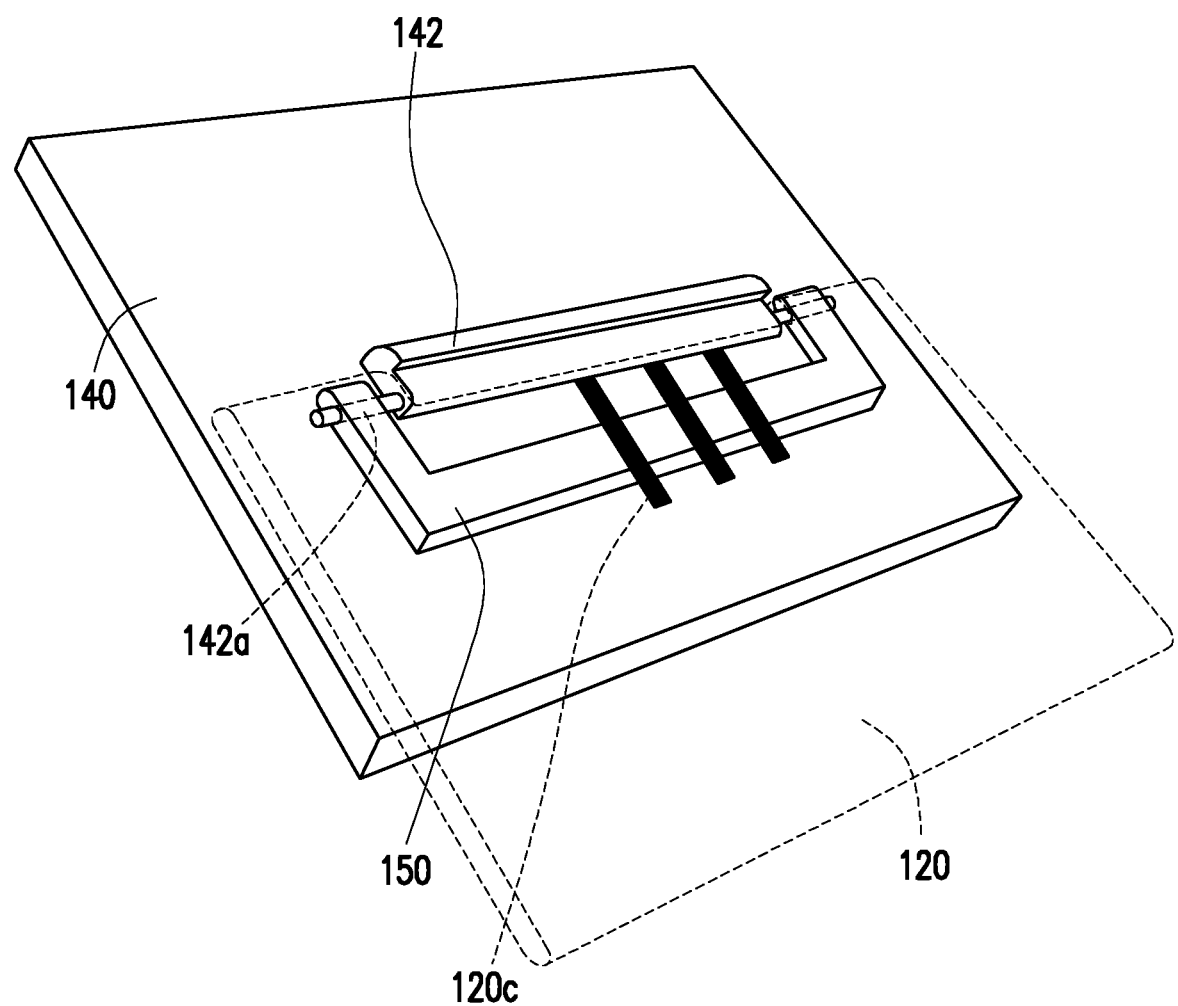

FIG. 8 is a schematic view of some members of the electronic device of FIG. 1. FIG. 9A and FIG. 9B illustrate that the display and a guide component of FIG. 8 move relative to the support component. Referring to FIG. 8, FIG. 9A and FIG. 9B, the electronic device 100 (labeled in FIG. 1) of the present embodiment further includes a guide component 150. The connecting part 142 is pivoted to the guide component 150. The guide component 150 has a plurality of first guide structures 152 and is slidably disposed inside the support component 120. The support component 120 has a plurality of second guide structures 120c. The first guide structure 152 and the second guide structure 120c cooperate to guide the connecting part 142 and the guide component 150 to smoothly slide relative to the support component 120 between the states shown in FIG. 9A and FIG. 9B. In FIG. 8, FIG. 9A and FIG. 9B, the first guide structure 152 and the second guide structure 120c are illustrated in a schematic manner. In fact, the first guide structure 152 and the second guide structure 120c may respectively be a guide groove and a guide rib slidable to each other, or may be other suitable guide structures that are slidable to each other. The invention is not limited thereto.

In summary, in the electronic device of the invention, in addition to the display as the main display interface, the flexible display panel is disposed as the auxiliary display interface. The display may be turned over such that the display and the flexible display panels are located on the same side of the support component or on different sides of the support component. Also, the electronic device can be switched to different operation modes according to changes in display screens displayed by the display and the flexible display panel. In the invention, since the flexible display panel instead of a general display which is non-flexible and of large thickness is used as the auxiliary display interface, it does not excessively increase the volume of the electronic device or excessively occupy configuration space in the electronic device.

What is claimed is:

1. An electronic device comprising:
   a main frame;
   a support component pivoted to the main frame;
   a flexible display panel connected between the main frame and the support component, wherein the support component is adapted to be closed to the main frame such that the flexible display panel is folded between the main frame and the support component, and the support component is adapted to be opened from the main frame such that the flexible display panel is expanded; and
   a display movably connected to the support component, wherein when the support component is opened from the main frame, the display is adapted to rotate relative to the support component to a first state such that the display and the flexible display panel are located on the same side of the support component, and to rotate relative to the support component to a second state such that the display and the flexible display panel are located on different sides of the support component, wherein when the support component is closed to the main frame, the display is adapted to be sandwiched between the main frame and the support component.

2. The electronic device according to claim 1, wherein when the support component is closed to the main frame, the support component is adapted to be sandwiched between the main frame and the display.

3. The electronic device according to claim 1, wherein the main frame has an input interface, and one end of the flexible display panel is adjacent to the input interface.

4. The electronic device according to claim 3, wherein a portion of the flexible display panel adjacent to the input interface is adapted to function as a virtual button.

5. The electronic device according to claim 1, wherein when the display and the flexible display panel are located on the same side of the support component, at least a portion of the flexible display panel is exposed between the display and the main frame.

6. The electronic device according to claim 1, wherein when the display and the flexible display panel are located on different sides of the support component, the display and the flexible display panel are adapted to display the same screen or respectively display corresponding screens.

7. The electronic device according to claim 1, wherein the display has a connecting part, and the connecting part is slidably disposed on the support component and is adapted to slide between a first position and a second position relative to the support component, wherein when the connecting part is in the first position, an interference between the support component and the display limits the display to the first state, and when the connecting part is in the second position, the display is adapted to rotate relative to the support component to the second state.

8. The electronic device according to claim 7, wherein the connecting part comprises a pivot, the support component has a sliding groove, and the pivot is slidably disposed in the sliding groove.

9. The electronic device according to claim 7, wherein when the connecting part is in the first position, an end face of the connecting part is flush with an end face of the support component.

10. The electronic device according to claim 7, comprising a guide component, wherein the connecting part is pivoted to the guide component, the guide component has at least one first guide structure and is slidably disposed on the support component, the support component has at least one second guide structure, the at least one first guide structure and the at least one second guide structure cooperate to guide the connecting part and the guide component to slide relative to the support component.

11. The electronic device according to claim 1, wherein at least one of the main frame and the support component has at least one covering part, and the at least one covering part covers a portion of a peripheral edge of the flexible display panel.

12. The electronic device according to claim 11, wherein a bending section of the flexible display panel is located between the main frame and the support component, and is adapted to bend as the support component rotates relative to the main frame, the at least one covering part has a concessive notch, and the concessive notch extends to an end of the at least one covering part and provides space for bending of the bending section of the flexible display panel.

13. The electronic device according to claim 12, wherein the flexible display panel has at least one adhering section adjacent to the bending section, the at least one adhering section is adhered to the main frame or the support component, and the concessive notch extends from a junction of the bending section and the at least one adhering section to the end of the at least one covering part.

14. The electronic device according to claim 1, wherein a bending section of the flexible display panel is located between the main frame and the support component, and is adapted to bend as the support component rotates relative to the main frame, at least one of the main frame and the support component has at least one shielding part, and the at least one shielding part shields at least a portion of a side edge of the bending section of the flexible display panel.

15. The electronic device according to claim 1, wherein a bending section of the flexible display panel is located between the main frame and the support component, and is adapted to bend as the support component rotates relative to the main frame, at least one of the main frame and the support component has a concessive recess, a back surface of the bending section of the flexible display panel faces the concessive recess, and the concessive recess provides space for bending of the bending section of the flexible display panel.

* * * * *